(12) United States Patent
Noh et al.

(10) Patent No.: US 12,037,257 B2
(45) Date of Patent: Jul. 16, 2024

(54) METHOD OF PRODUCING PEROVSKITE NANOCRYSTALLINE PARTICLE USING FLUID MOLD

(71) Applicant: POSTECH Research and Business Development Foundation, Pohang-si (KR)

(72) Inventors: Yongyoung Noh, Daejeon (KR); Youngki Kim, Pohang-si (KR); Jisu Hong, Pohang-si (KR)

(73) Assignee: POSTECH RESEARCH AND BUSINESS DEVELOPMENT FOUNDATION, Pohang-si (KR)

( * ) Notice: Subject to any disclaimer, the term of this patent is extended or adjusted under 35 U.S.C. 154(b) by 163 days.

(21) Appl. No.: 17/420,769

(22) PCT Filed: Dec. 9, 2020

(86) PCT No.: PCT/KR2020/017900
§ 371 (c)(1),
(2) Date: Jul. 6, 2021

(87) PCT Pub. No.: WO2021/137462
PCT Pub. Date: Jul. 8, 2021

(65) Prior Publication Data
US 2022/0372609 A1 Nov. 24, 2022

(30) Foreign Application Priority Data

Jan. 3, 2020 (KR) .................. 10-2020-0000591
Dec. 1, 2020 (KR) .................. 10-2020-0165538

(51) Int. Cl.
*C01G 19/00* (2006.01)
*B82Y 40/00* (2011.01)
(Continued)

(52) U.S. Cl.
CPC ............ *C01G 19/006* (2013.01); *B82Y 40/00* (2013.01); *C01G 21/006* (2013.01);
(Continued)

(58) Field of Classification Search
CPC .. C01G 19/006; C01G 21/006; C01G 29/006; C01G 30/002; C01G 45/006;
(Continued)

(56) References Cited

U.S. PATENT DOCUMENTS

2018/0208840 A1   7/2018   Luchinger et al.

FOREIGN PATENT DOCUMENTS

KR   10-2016-0055090   5/2016
KR   10-2018-0006941   1/2018
(Continued)

OTHER PUBLICATIONS

EPO, Search Report of EP 20908460.7 dated Sep. 2, 2022.
(Continued)

*Primary Examiner* — C Melissa Koslow
(74) *Attorney, Agent, or Firm* — LEX IP MEISTER, PLLC

(57) ABSTRACT

A method of producing perovskite nanocrystalline particles using a liquid crystal includes a first operation for preparing a mixed solution including a first precursor compound, a
(Continued)

second precursor compound, and a first solvent. a second operation for preparing a precursor solution by adding an organic ligand to the prepared mixed solution, a third operation for performing crystallization treatment after adding the prepared precursor solution to a reactor containing a liquid crystal, and a fourth operation for separating the perovskite nanocrystalline particles from the crystallized solution through a centrifugal separator.

11 Claims, 7 Drawing Sheets

(51) Int. Cl.
| | |
|---|---|
| C01G 21/00 | (2006.01) |
| C01G 29/00 | (2006.01) |
| C01G 30/00 | (2006.01) |
| C01G 45/00 | (2006.01) |
| C09K 11/57 | (2006.01) |
| C09K 11/66 | (2006.01) |
| C09K 11/74 | (2006.01) |
| C09K 11/75 | (2006.01) |
| C30B 7/14 | (2006.01) |

(52) U.S. Cl.
CPC ......... *C01G 29/006* (2013.01); *C01G 30/002* (2013.01); *C01G 45/006* (2013.01); *C09K 11/57* (2013.01); *C09K 11/664* (2013.01); *C09K 11/665* (2013.01); *C09K 11/7428* (2013.01); *C09K 11/7435* (2013.01); *C09K 11/755* (2013.01); *C09K 11/756* (2013.01); *C30B 7/14* (2013.01)

(58) Field of Classification Search
CPC ..... C09K 11/57; C09K 11/664; C09K 11/665; C09K 11/7428; C09K 11/7455; C09K 11/755; C09K 11/756
See application file for complete search history.

(56) References Cited

FOREIGN PATENT DOCUMENTS

| KR | 10-2018-0046198 | 5/2018 |
|---|---|---|
| KR | 10-2018-0132765 | 12/2018 |

OTHER PUBLICATIONS

Kenneth C. K. Cheng et al., "Templated nanofiber synthesis via chemical vapor polymerization into liquid crystalline films", Science 362, 804-808,Nov. 16, 2018.

Javad Shamsi et al., "Metal Halide Perovskite Nanocrystals: Synthesis, Post-Synthesis Modifications, and Their Optical Properties", Chem. Rev. 2019, 119, 3296-3348, Feb. 13, 2019.

Hailong Huang et al., "Emulsion Synthesis of Size-Tunable $CH_3NH_3PbBr_3$ Quantum Dots: An Alternative Route toward Efficient Light-Emitting Diodes", ACS Appl. Mater. Interfaces Jul. 2015, 28128-28133, Dec. 12, 2015.

Feng Zhang et al., "Brightly Luminescent and ColorTunable Colloidal $CH_3NH_3PbX_3$ (X=Br, I, Cl) Quantum Dots: Potential Alternatives for Display Technology", ACS Nano Sep. 4, 2015, 4533-4542, Mar. 30, 2015.

Georgios N Karanikolos et al., "Water-based synthesis of ZnSe nanostructures using amphiphilic block copolymer stabilized lyotropic liquid crystals as templates", Nanotechnology, 2006, vol. 17, pp. 3121-3128, Jun. 5, 2006.

Pengcheng Lin et al., "All-inorganic perovskite quantum dots stabilized blue phase liquid crystals", Optics express, 2018, vol. 26, Issue 14, pp. 18310-18319, Jul. 2, 2018.

Wenzhao Sun et al., "Tunable perovskite microdisk lasers", Nanoscale, 2016, vol. 8, Issue 16, pp. 8717-8721.

Andrea L. Rodarte et al., "Tuning quantum-dot organization in liquid crystals for robust photonic applications", ChemPhysChem, 2014, vol. 15, Issue 7, pp. 1413-1421.

Michael C. Brennan et al., "Origin of the size-dependent stokes shift in $CsPbBr_3$ perovskite nanocrystals", Journal of the american chemical society, 2017, vol. 139, Issue 35, pp. 12201-12208, Aug. 3, 2017.

Ioannis Lignos et al., "Synthesis of cesium lead halide perovskite nanocrystals in a droplet-based microfluidic platform: fast parametric space mapping", Nano letters, 2016, vol. 16, Issue 3, pp. 1869-1877, Feb. 2, 2016.

KIPO, PCT Search Report of PCT/KR2020/017900 dated Mar. 9, 2021.

METHOD OF PRODUCING PEROVSKITE NANOCRYSTALLINE PARTICLE USING FLUID MOLD

STATEMENT REGARDING GOVERNMENT SUPPORT

This invention was supported at least in part by ministry of Science and ICT of South Korean government for research project, the title of which is "Low-dimensional perovskite materials and opto-electric device laboratory" (Project Number: 2020R1A4A1019455) managed by NFR (National Research Foundation of Korea).

Also, this invention was supported at least in part by ministry of Science and ICT of South Korean government for research project, the title of which is "Synthesis of Perovskite Nano-Crystal via Microfluidic System based on Mesogenic Fluids" (Project Number: 2021R1A2C2095010) managed by NFR (National Research Foundation of Korea).

TECHNICAL FIELD

Embodiments of the inventive concept described herein relate to a method of producing perovskite nanocrystalline particles using a liquid crystal.

BACKGROUND ART

Perovskite may be a material having a crystal structure of $ABX_3$, "A" and "B" are cations, "X" is an anion, and particularly, may include organic-inorganic composite perovskite of a three-dimensional structure having an organic cation as "A", an inorganic cation as "B", and a halogen anion as "X".

The organic-inorganic composite perovskite has excellent optical and electrical properties, is applied as semiconductors of various electronic devices, has a low band gap of 1.5 to 2.3 Ev and a low exciton binding energy, has a long diffusion distance between electrons and holes, has high electron mobility and hole mobility, and has a balanced mobility.

In general, it is advantageous to increase the exciton binding energy for using the organic-inorganic composite perovskite in a visible light-emitting diode (LED). To this end, low-dimensional organic-inorganic composite perovskite is synthesized to have a quantum confinement effect.

In addition, a semiconductor nanocrystalline particle within a range of the quantum confinement effect is called a quantum dot. Organic-inorganic complex perovskite quantum dots are capable of controlling emission wavelength through adjustment of halogen anions, have high color purity, are fast, and have high quantum yield by inducing efficient electron-hole recombination (radiative recombination).

Meanwhile, to use the organic-inorganic complex perovskite quantum dots for a next-generation display, the organic-inorganic complex perovskite quantum dots are capable of being controlled to have excellent and uniform luminescence characteristics, and a synthesis system capable of mass production should be developed.

A ligand assisted reprecipitation method, one of the currently reported synthesis systems, is a method of simply synthesizing perovskite quantum dots by mixing a perovskite precursor and a solvent in a solution. The method has excellent dispersibility of the synthesized quantum dots and high light emission quantum efficiency, but aggregation occurs during a crystal growth process of perovskite, resulting in low synthesis yield of quantum dots, and it is difficult to control the size of quantum dots and to clean and purify quantum dots, thereby being unsuitable for mass production.

Accordingly, for mass production of perovskite quantum dots with excellent luminescence properties, while maintaining the advantages of easy synthesis of the ligand assisted reprecipitation method, there is a need to develop a synthesis system that has high synthesis yield, easy control of the size of quantum dots, and facilitates purification.

DETAILED DESCRIPTION OF THE INVENTION

Technical Problem

Embodiments of the inventive concept provide a method of producing perovskite nanocrystalline particles using a liquid crystal capable of increasing production yield while preventing excessive growth and aggregation of the nanocrystalline particles during the growth of the perovskite nanocrystalline particles.

In addition, it is to provide a method of producing perovskite nanocrystalline particles using a liquid crystal, which is easy to control the size of perovskite nanocrystalline particles, has a narrow size distribution, and has excellent luminescence properties.

Technical Solution

According to an exemplary embodiment, a method of producing perovskite nanocrystalline particles using a liquid crystal includes a first operation for preparing a mixed solution including a first precursor compound represented by a following formula (1), a second precursor compound represented by a following formula (2), and a first solvent, a second operation for preparing a precursor solution by adding an organic ligand to the prepared mixed solution, a third operation for performing crystallization treatment after adding the prepared precursor solution to a reactor containing a liquid crystal, and a fourth operation for separating the perovskite nanocrystalline particles from the crystallized solution through a centrifugal separator.

$$AX \qquad\qquad \text{[Formula 1]}$$

(In Formula 1, "A" is $Cs^+$ or an organic cation; "X" is at least one anion selected from a group consisting of $Br^-$, $Cl^-$, and $I^-$.)

$$BX_2 \qquad\qquad \text{[Formula 2]}$$

(In Formula 2, "B" is at least one cation selected from a group consisting of $Pb^{2+}$, $Sn^{2+}$, $Bi^{2+}$, $Sb^{2+}$, and $Mn^{2+}$; "X" is at least one anion selected from a group consisting of $Br^-$, $Cl^-$, and $I^-$.)

In addition, the first operation may include preparing a precursor mixture by mixing the first precursor compound and the second precursor compound at a molar ratio of 1:1 to 1:25 and dissolving the prepared precursor mixture in the first solvent to be ionized.

In addition, in the first operation, the first solvent may be a polar aprotic solvent, and the polar aprotic solvent may be at least one material selected from a group consisting of dimethylformamide and dimethylsulfoxide.

In addition, the organic cation may be at least one cation selected from a group consisting of methyl ammonium cation, formamidinium cation, and phenylethylammonium cation.

In addition, in the second operation, the organic ligand may include $R^1COOH$ and $R^2NH_2$, and the $R^1$ and the $R^2$ may be a saturated alkyl group or an unsaturated alkenyl group having 6 to 28 carbon atoms, regardless of each other.

In addition, in the second operation, the organic ligand may be prepared by mixing the $R^1COOH$ and the $R^2NH_2$ in a volume ratio of 1:0.01 to 0.1.

In addition, in the second operation, the organic ligand may be prepared by mixing the $R^2NH_2$ and the $R^1COOH$ in a volume ratio of 1:10 to 100.

In addition, in the third operation may include preparing a fluid mixture by mixing the prepared precursor solution and the liquid crystal and stirring the prepared fluid mixture at a stirring temperature in a range of 25 to 65° C. for 1 to 3 hours.

In addition, in the stirring, the liquid crystal may act as a non-solvent for the first precursor compound and the second precursor compound to induce generation and growth of perovskite crystal nuclei, to form the perovskite nanocrystalline particles.

In addition, in the stirring, the perovskite nanocrystalline particles may be limited in particle growth by elastic force of the liquid crystal which occurs when the perovskite nanocrystalline particles become larger than an extrapolation length defined by an elastic constant and a surface anchoring coefficient of the liquid crystal.

In addition, the extrapolation length defined by the liquid crystal may be controlled depending on the amount of $R^1COOH$ contained in the organic ligand, the amount of $R^2NH_2$ contained in the organic ligand, or the stirring temperature, and the size of the perovskite nanocrystalline particles may be controlled by controlling the extrapolation length.

Advantageous Effects of the Invention

The method of producing the perovskite nanocrystalline particles using the liquid crystal according to an embodiment of the inventive concept may increase the production yield while preventing the excessive growth and aggregation of nanocrystalline particles during the growth process of the perovskite nanocrystalline particles.

In addition, it is easy to control the size of the perovskite nanocrystalline particles, and the perovskite nanocrystalline particles may be controlled to have the smaller and uniform size and excellent crystallinity than the nanocrystalline particles prepared by the conventional method.

It is possible to overcome the low stability, which is a disadvantage of the conventional method of using chlorine as a halogen anion to implement a quantum dot emitting blue light.

In addition, it is possible to produce perovskite nanocrystalline particles having uniform and excellent light-emitting characteristics, and to fabricate a light-emitting device having high color purity and luminous efficiency.

BEST MODE

Figure 1:
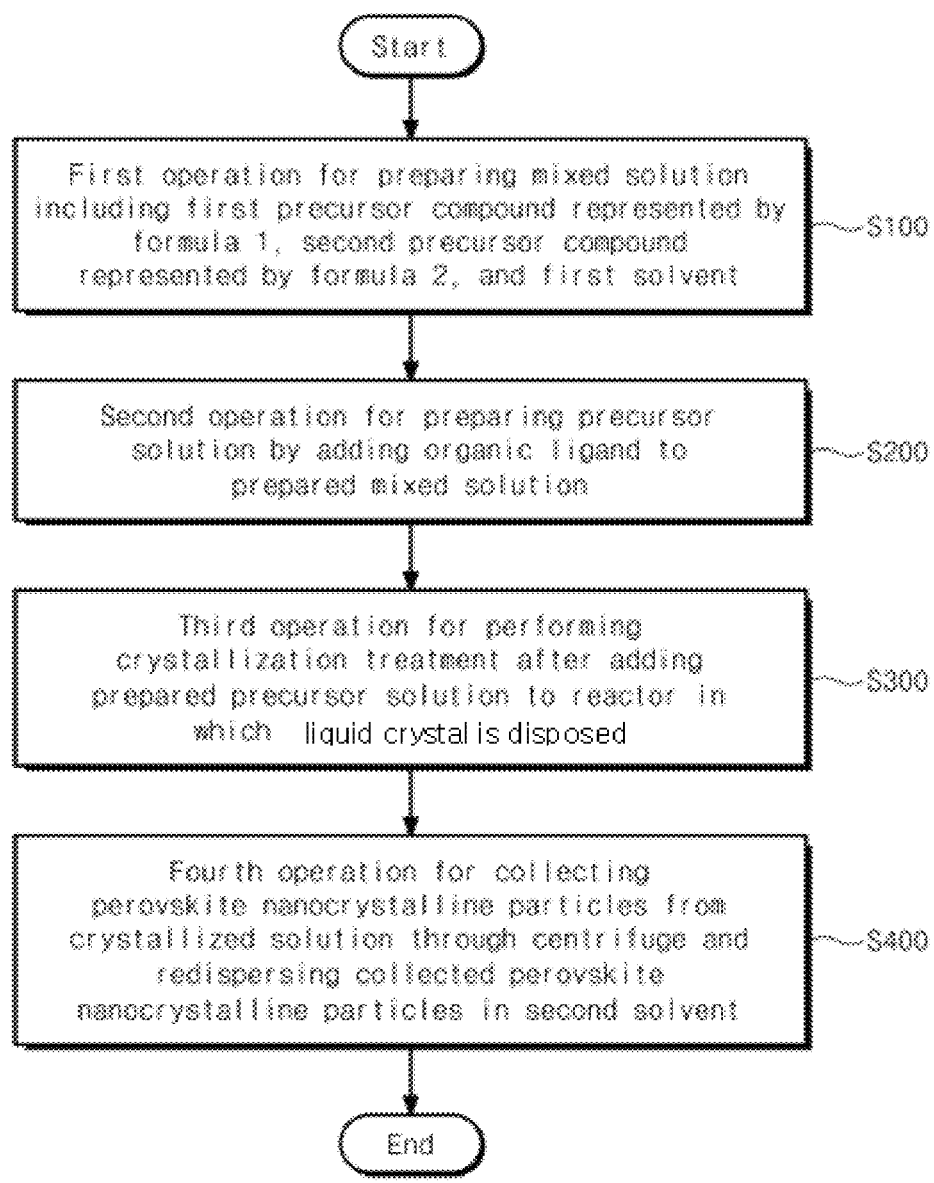
FIG. 1 is a flowchart illustrating a method of producing perovskite nanocrystalline particles using a liquid crystal according to an embodiment of the inventive concept.

Hereinafter, embodiments of the inventive concept will be described in further detail with reference to the accompanying drawings.

Further, detailed description of well-known functions and structures incorporated herein may be omitted to avoid obscuring the subject matter of the inventive concept.

Embodiments are provided so that this disclosure will be thorough and complete, and will fully convey the concept of the disclosure to those skilled in the art and the disclosure may be embodied in many different forms and should not be construed as being limited to the embodiments set forth herein.

Rather, these embodiments are provided so that this disclosure will be thorough and complete, and will fully convey the concept of the disclosure to those skilled in the art.

Also, in the drawings, thickness and size of each layer are exaggerated for convenience and clarity of explanation, and like reference numerals denote like elements in the drawings. As used herein, the term "and/or" includes any and all combinations of any of listed items.

The terminology used herein is for the purpose of describing particular embodiments only and is not intended to be limiting of the inventive concept.

As used herein, the singular forms are intended to include the plural forms as well, unless the context clearly indicates otherwise. It will be further understood that the terms "comprises" and/or "comprising," when used in this specification, specify the presence of stated components, steps, operations, and/or elements, but do not preclude the presence or addition of one or more other components, steps, operations, elements, and/or groups thereof.

Figure 2:
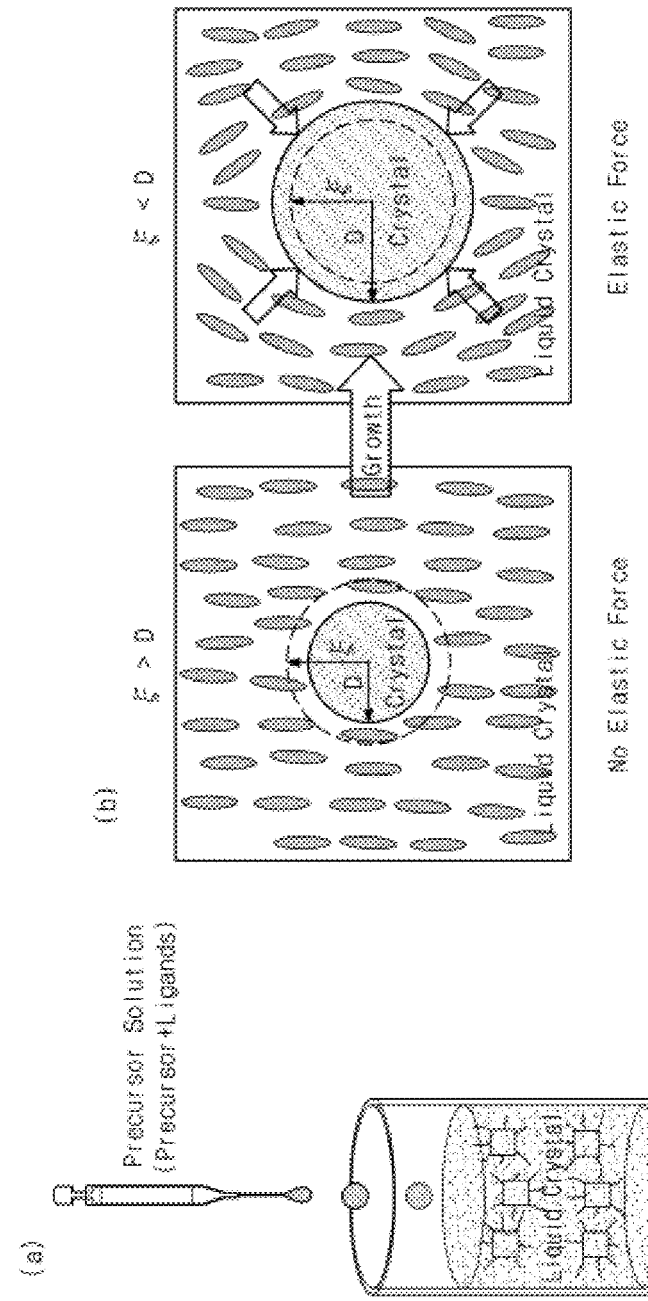
FIG. 2 is a view illustrating a producing process of perovskite nanocrystalline particles using a liquid crystal according to an embodiment of the inventive concept.

FIG. 1 is a flowchart illustrating a method of producing perovskite nanocrystalline particles using a liquid crystal according to an embodiment of the inventive concept, and FIG. 2 is a view illustrating a producing process of perovskite nanocrystalline particles using a liquid crystal according to an embodiment of the inventive concept.

Referring to FIGS. 1 and 2, a method for producing perovskite nanocrystalline particles using a liquid crystal according to an embodiment of the inventive concept may include a first operation in S100 which is preparing a mixed solution including a first precursor compound represented by a following Formula 1, a second precursor compound represented by a following Formula 2, and a first solvent, a second operation in S200 which is preparing a precursor solution by adding an organic ligand to the prepared mixed solution, a third operation in S300 which is performing crystallization treatment after adding the prepared precursor solution to a reactor in which the liquid crystal is disposed, and a fourth operation in S400 which is collecting perovskite nanocrystalline particles from the crystallized solution through a centrifuge and redispersing the collected perovskite nanocrystalline particles in a second solvent.

In detail, during the crystallization treatment for the formation of perovskite nanocrystalline particles after preparing the precursor solution, the growth of perovskite nanocrystalline particles may be limited and controlled while generation and growth of the perovskite nanocrystalline particles using a liquid crystal is induced. Furthermore, it is possible to control the size of perovskite nanocrystalline particles by adjusting extrapolation length defined by an elastic constant and a surface anchoring coefficient of the liquid crystal.

Hereinafter, the method for producing the perovskite nanocrystalline particles using the liquid crystal according to an embodiment of the inventive concept will be described in detail for each operation.

In addition, each operation may be illustrated as shown in FIGS. 2A and 2B. FIG. 2A is view illustrating a state of forming the perovskite nanocrystalline particles by adding the precursor solution to the liquid crystal and FIG. 2B is view illustrating elastic force of the liquid crystal applied to the nanocrystalline particles depending on a size change of the perovskite nanocrystalline particles.

First, the first operation in S100 is an operation for preparing the mixed solution including the first precursor compound represented by the following Formula 1, the second precursor compound represented by a following Formula 2, and the first solvent.

In operation S100, the first precursor compound and the second precursor compound according to an embodiment of the inventive concept satisfy the following Formula 1 and Formula 2, respectively.

$$AX \quad \text{[Formula 1]}$$

In Formula 1, "A" is $Cs^+$ or an organic cation; "X" is at least one anion selected from a group consisting of $Br^-$, $Cl^-$, and $I^-$.

Preferably, "A" may be an organic cation, specifically, and the organic cation may be at least one selected from a group consisting of methylammonium cation, formamidinium cation, and phenylethylammonium cation.

$$BX_2 \quad \text{[Formula 2]}$$

In Formula 2, "B" is at least one cation selected from a group consisting of $Pb^{2+}$, $Sn^{2+}$, $Bi^{2+}$, $Sb^{2+}$, and $Mn^{2+}$; "X" is at least one anion selected from a group consisting of $Br^-$, $Cl^-$, and $I^-$.

In addition, operation S100 may include preparing a precursor mixture by mixing the first precursor compound and the second precursor compound at a molar ratio of 1:1 to 1.25 and dissolving the prepared precursor mixture in the first solvent to ionize.

In addition, in operation S100, the first solvent is a polar aprotic solvent, and the polar aprotic solvent may be at least one material selected from a group consisting of N, N-dimethylformamide and dimethyl sulfoxide.

Preferably, in operation S100, the first precursor compound and the second precursor compound, which are perovskite precursors, may be mixed in a molar ratio of 1:1.25.

In addition, the ionizing may include a conventional method used in the art. For example, the perovskite precursor may be stirred using a stirring bar and a stirrer such that the perovskite precursor is dissolved in the first solvent.

Next, the second operation in S200 is preparing the precursor solution by mixing the organic ligand with the mixed solution prepared through the first operation in S100.

In operation S200, the organic ligand may include $R^1COOH$ and $R^2NH_2$, and the $R^1$ and $R^2$ may be a saturated alkyl group or an unsaturated alkenyl group having 6 to 28 carbon atoms regardless of one another.

In detail, the $R^1COOH$ is oleic acid, the $R^2NH_2$ is oleylamine or octylamine.

In addition, the organic ligand may be prepared by mixing the $R^1COOH$ and the $R^2NH_2$ in a volume ratio of 1:0.01 to 0.1 in an embodiment, and may be prepared by mixing the $R^2NH_2$ and the $R^1COOH$ in a volume ratio of 1:10 to 100 in another embodiment.

Meanwhile, the amount of the organic ligand to be mixed may determine the size of the perovskite nanocrystalline particles. In detail, in operation S200, the size of the perovskite nanoparticles may be controlled depending on the amount of mixed $R^1COOH$ and the amount of mixed $R^2NH_2$.

More specifically, when the organic ligand is prepared by mixing the $R^1COOH$ and the $R^2NH_2$ of operation S200 in a volume ratio of 1:0.01 to 0.1, the size of the perovskite nanoparticles decreases as the amount of $R^2NH_2$ increases in the organic ligand, and the size of the perovskite nanoparticles increases as the amount of $R^2NH_2$ contained in the organic ligand decreases.

In addition, when the organic ligand is prepared by mixing the $R^1COOH$ and the $R^2NH_2$ of operation S200 in a volume ratio of 1:10 to 100, the size of the perovskite nanoparticles increases as the amount of $R^1COOH$ increases in the organic ligand, and the size of the perovskite nanoparticles decreases as the amount of $R^1COOH$ contained in the organic ligand decreases.

Next, third operation in S300 is an operation including crystallizing the perovskite precursor into perovskite crystal nuclei using the liquid crystal and growing the crystallized perovskite crystal nuclei to form the perovskite nanocolon particles.

Here, the liquid crystal is at least one material selected from a group consisting of a nematic liquid crystal, a smectic liquid crystal, a cholsteric liquid crystal, and a lyotropic liquid crystal.

In one embodiment of the inventive concept, the liquid crystal may be used without limitation as long as it is a liquid crystal having a liquid crystal phase within a specific temperature range, and preferably, a liquid crystal having a liquid crystal phase in a wide temperature range may be used.

Furthermore, in an embodiment of the inventive concept, the liquid crystal is formed of a nematic liquid crystal, and specifically, the nematic liquid crystal is preferably E7 which is a cyanobiphenyl-based liquid crystal. In addition, the E7 may include 4-cyano-4'-pentylbiphenyl.

Operation S300 may include preparing the fluid mixture by mixing the prepared precursor solution and the liquid crystal in a volume ratio of 1:10 to 50 and stirring the prepared fluid mixture at a stirring temperature in a range of 25 to 65° C. for 1 to 3 hours.

In the stirring of operation S300, the liquid crystal may act as a non-solvent for the first precursor compound and the second precursor compound, which are perovskite precursors, to allow generation and growth of the perovskite crystal nuclei to be induced, and thus the perovskite nanocrystalline particles may be formed in the liquid crystal.

Here, the perovskite nanocrystalline particles may grow continuously, and a ligand may be bound to the surface thereof.

In addition, in the stirring of operation S300, the perovskite nanocrystalline particles are limited in particle growth by the elastic force of the liquid crystal which occurs when the perovskite nanocrystalline particles become larger than the extrapolation length defined by the elastic constant and surface anchoring coefficient of the liquid crystal.

In detail, because the liquid crystal has a specific elastic modulus and a surface energy coefficient, when the size of the perovskite nanocrystalline particles grows more than the extrapolation length defined by the liquid crystal, a change in orientation of liquid crystal molecules in the liquid crystal is induced, and the growth of the perovskite nanocrystalline particles is limited by the elastic force that the liquid crystal molecules try to return to their original state.

That is, the perovskite nanocrystalline particles may be grown to a state in which growth force of the perovskite nanocrystalline particles and the elastic force of the liquid crystal are in equilibrium. It is preferable that the perovskite nanocrystalline particles have a size of 2 to 30 nm in one embodiment of the inventive concept.

Accordingly, in the stirring of operation S300, the formed perovskite nanocrystalline particles may be used as quantum dots, which are semiconductor nanoparticles within a range of quantum confinement effects.

In addition, the extrapolation length defined by the liquid crystal may be controlled depending on the amount of $R^1COOH$ contained in the organic ligand, the amount of $R^2NH_2$ contained in the organic ligand, or the stirring temperature, and the size of the perovskite nanocrystalline particles may be controlled by controlling the extrapolation length.

That is, because the size of the perovskite nanocrystalline particles is decreased or increased depending on the extrapolation length defined by the liquid crystal, the elastic modulus and the surface energy modulus of the liquid crystal may be changed through adjusting the amount of the organic ligand in the second operation in S200, or by controlling the stirring temperature in the third operation in S300, thereby controlling the extrapolation length defined by the liquid crystal.

More specifically, the amount of the organic ligand or the stirring temperature may change the extrapolation length defined by the liquid crystal. For example, as the amount of $R^2NH_2$ in the organic ligand prepared by mixing the $R^1COOH$ and the $R^2NH_2$ in a volume ratio of 1:0.01 to 0.1 decreases, the amount of $R^1COOH$ in the organic ligand prepared by mixing the $R^2NH_2$ and the $R^1COOH$ in a volume ratio of 1:10 to 100 increases, or the stirring temperature increases while the amount of the organic ligand is fixed, the size of the extrapolation length may increase, and thus the size of the perovskite nanocrystalline particles may increase.

On the other hand, as the amount of $R^2NH_2$ in the organic ligand prepared by mixing the $R^1COOH$ and the $R^2NH_2$ in a volume ratio of 1:0.01 to 0.1 increases, the amount of $R^1COOH$ in the organic ligand prepared by mixing the $R^2NH_2$ and the $R^1COOH$ in a volume ratio of 1:10 to 100 decreases, or the stirring temperature decreases while the amount of the organic ligand is fixed, the size of the extrapolation length may decrease, and thus the size of the perovskite nanocrystalline particles may decrease.

As shown in FIG. 2B, in the method for producing the perovskite nanocrystalline particles using the liquid crystal according to an embodiment of the inventive concept, the size of the perovskite nanocrystalline particles may be changed depending on the size of the extrapolation length defined by the liquid crystal.

For example, when the perovskite precursor under a predetermined condition is crystallized into the perovskite crystal nuclei in the liquid crystal, and the perovskite crystal nuclei grow to form the perovskite nanocrystalline particles, the growth of the perovskite nanocrystalline particles may be continued until the growth of the particles is stopped by the elastic force induced when it becomes larger than the extrapolation length defined by the liquid crystal and the perovskite nanocrystalline particles grow to the extrapolation length defined by the liquid crystal, which is an area indicated by a dotted line in FIG. 2B. Here, a radius (D) of each perovskite nanocrystalline particle is substantially the same as a radius (ξ) of the extrapolation length defined by the liquid crystal, which is the area indicated by the dotted line.

Meanwhile, as described above, in the method for producing the perovskite nanocrystalline particles using the liquid crystal according to an embodiment of the inventive concept, when the amount of $R^1COOH$ decreases or the amount of $R^2NH_2$ increases, or the stirring temperature decreases, the extrapolation length defined by the liquid crystal decreases, and thus the growth of the perovskite nanocrystalline particles is limited to a smaller size.

Next, the fourth operation in S400 is separating the perovskite nanocrystalline particles formed in the liquid crystal.

Operation S400 includes collecting the perovskite nanocrystalline particles by centrifuging the crystallized solution containing an unreacted perovskite precursor, an unreacted organic ligand, the first solvent, the liquid crystal, and the perovskite nanocrystalline particles; and redispersing the collected perovskite nanocrystalline particles in the second solvent.

Here, the second solvent may be at least one material selected from a group consisting of toluene, hexane, and octane.

That is, in operation S400, after the perovskite nanocrystalline particles are formed, the perovskite nanocrystalline particles may be separated from the unreacted perovskite precursor, the unreacted organic ligand, the first solvent, and the liquid crystal.

<Example 1> Preparation of Quantum Dot Dispersion of Perovskite Nanocrystalline Particle Operation S100: 0.016 mmol of a $CH_3NH_3Br$ perovskite precursor and 0.2 mmol of a $PbBr_2$ perovskite precursor were dissolved in 5 mL of a dimethylformamide solvent to prepare an ionized mixed solution.

Here, it was stirred using a stirring bar such that the perovskite precursor could be dissolved.

Operation S200: An organic ligand prepared by mixing oleic acid ($R^1COOH$) and octylamine ($R^2NH_2$) in a volume ratio of 1:0.04 was added to the prepared mixed solution, followed by stirring to prepare a precursor solution.

Operation S300: 0.2 mL of the precursor solution was mixed with 5 mL of liquid crystal to prepare a fluid mixture, and the fluid mixture was stirred at a stirring temperature of 25° C. for 2 hours.

Here, the liquid crystal was used E7 containing 4-cyano-4'-pentylbiphenyl.

Operation S400: Perovskite nanocrystalline particles formed in operation S300 were collected through a centrifugal separator, and the collected perovskite nanocrystalline particles were redispersed in a toluene solvent to prepare a quantum dot dispersion of the perovskite nanocrystalline particles.

In addition, in operation S300, to check characteristics of the perovskite nanocrystalline particles depending on the stirring temperature, the stirring temperature is increased to crystallize the nanocrystalline particles, and in operation S400, and Samples X1 to X5, which are quantum dot dispersions including the nanocrystalline particles, were prepared.

In addition, for each of the samples, Sample X1 is a quantum dot dispersion in which perovskite nanocrystalline particles stirred with a stirring temperature of 25° C. are dispersed, Sample X2 is a quantum dot dispersion in which perovskite nanocrystalline particles are dispersed with a stirring temperature of 30° C., Sample X3 is a quantum dot dispersion in which perovskite nanocrystalline particles are dispersed with a stirring temperature of 35° C., Sample X4 is a quantum dot dispersion in which perovskite nanocrystalline particles are dispersed with a stirring temperature of 40° C., and Sample X5 is a quantum dot dispersion in which perovskite nanocrystalline particles are dispersed with a stirring temperature of 50° C.

In addition, in operation S200, to confirm the characteristics of the perovskite nanocrystalline particles depending on octylamine $R^2NH_2$, Samples X6 to X10 were prepared by increasing the amount of the octylamine.

In addition, for each of the samples, Sample X6 is a quantum dot dispersion in which perovskite nanocrystalline particles having an octylamine amount of 20 μL are dispersed, Sample X7 is a quantum dot dispersion in which perovskite nanocrystalline particles having an octylamine amount of 22.5 μL are dispersed, Sample X8 is a quantum dot dispersion in which perovskite nanocrystalline particles having an octylamine amount of 25 μL are dispersed, Sample X9 is a quantum dot dispersion in which perovskite nanocrystalline particles having an octylamine amount of 30 μL are dispersed, and Sample X10 is a quantum dot dispersion in which perovskite nanocrystalline particles having an octylamine amount of 40 μL are dispersed.

<Example 2> Preparation of Synthetic Stock Solution of Perovskite Nanocrystalline Particle Except for the operation S400 in Example 1, it was carried out in the same manner as in Example 1 to prepare a synthetic stock solution of the perovskite nanocrystalline particles.

<Example 3> Preparation of Quantum Dot Dispersion in which Size of Perovskite Nanocrystalline Particle is Filtered Sample X1 of Example 1 was subjected to additional centrifugation to prepare a quantum dot dispersion.

<Comparative Example 1> Preparation of Quantum Dot Dispersion of Perovskite Nanocrystalline Particle A quantum dot dispersion of perovskite nanocrystalline particles was prepared in the same manner as in Example 1, except that the liquid crystal was replaced with toluene (Comparative Example 1) in operation S300 of Example 1.

<Comparative Example 2> Preparation of Synthetic Stock Solution of Perovskite Nanocrystalline Particle A synthetic stock solution of perovskite nanocrystalline particles was prepared in the same manner as in Example 2, except that the liquid crystal was replaced with toluene in Example 2 (Comparative Example 2), <Comparative Example 3> Preparation of Quantum Dot Dispersion in which Size of Perovskite Nanocrystalline Particle is Filtered The quantum dot dispersion of perovskite nanocrystalline particles prepared through Comparative Example 1 was subjected to additional centrifugation to prepare a quantum dot dispersion (Comparative Example 3).

<Experimental Example 1> Real Image Analysis

Figure 3:
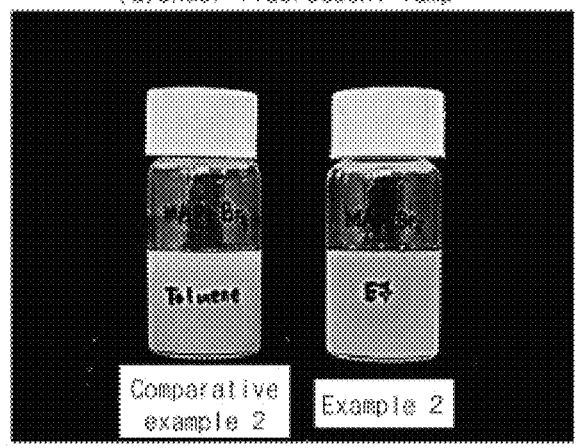
FIG. 3 illustrates photographs comparing synthetic stock solutions prepared according to Example 2 and Comparative Example 2 of the inventive concept.
Figure 3:
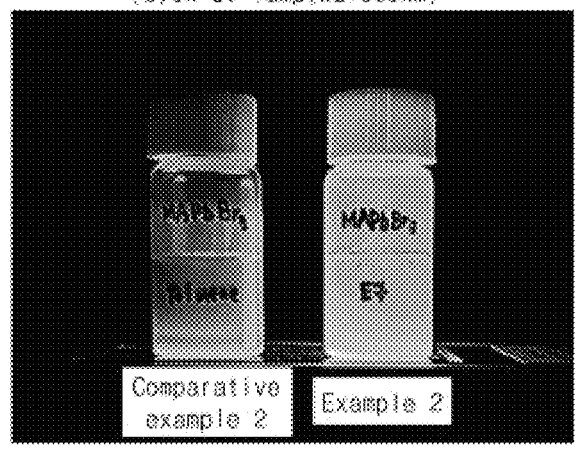

For evaluation of aggregation properties of perovskite nanocrystalline particles prepared by a method for producing perovskite nanocrystalline particles using a liquid crystal according to an embodiment of the inventive concept, after storing the synthetic stock solutions of perovskite nanocrystalline particles prepared in Example 2 and Comparative Example 2 in vial bottles, respectively, actual images are analyzed, and the results are shown in FIG. 3.

FIG. 3 illustrates photographs comparing synthetic stock solutions prepared according to Example 2 and Comparative Example 2 of the inventive concept.

FIG. 3A is an observation of the synthetic stock solutions of Example 2 and Comparative Example 2 under a fluorescent lamp. In the case of Comparative Example 2, as toluene is used instead of a liquid crystal, aggregation occurred during the growth of nanocrystalline particles, and it may be seen that color of the solution is red shifted because agglomerates each having a size of several tens of nanometers or more are generated.

On the contrary, in the case of Example 2, the liquid crystal is used, and it may be seen that the aggregation hardly occurs because the liquid crystal limits the growth and aggregation of the nanocrystalline particles.

FIG. 3B is an observation of the synthetic stock solutions of Example 2 and Comparative Example 2 on a UV lamp of 365 nm wavelength, it may be confirmed that light emission intensity of Example 2 is stronger than that of Comparative Example 2, and it is believed that this is because yield of the perovskite nanocrystalline particles of Example 2 is high.

<Experimental Example 2> Crystal Particle Size Analysis

Figure 4:
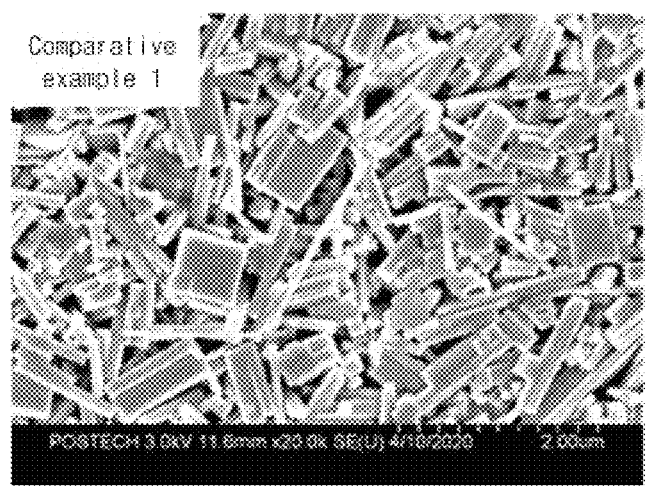
FIG. 4 illustrates photographs observed with a scanning electron microscopy (SEM) to compare sizes of the perovskite crystal particles according to Sample X1 of Example 1 and Comparative Example 1.
Figure 4:
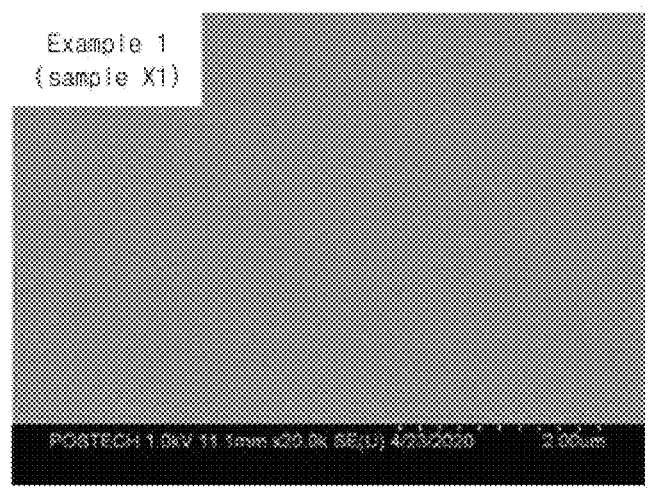
Figure 5:
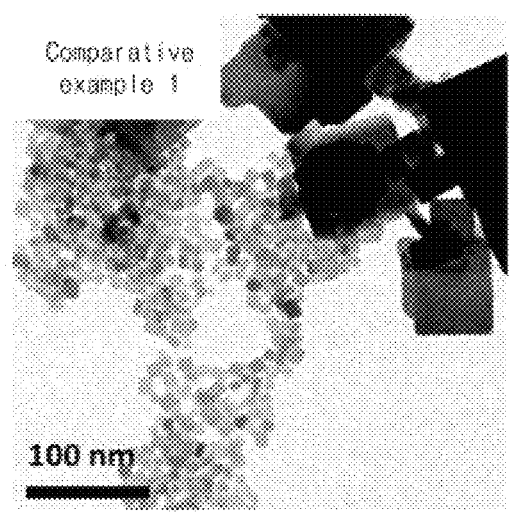
FIG. 5 illustrates photographs observed with a transmission electron microscopy (TEM) to compare sizes of perovskite nanocrystalline particles according to Sample X1 of Example 1 and Comparative Example 1.
Figure 5:
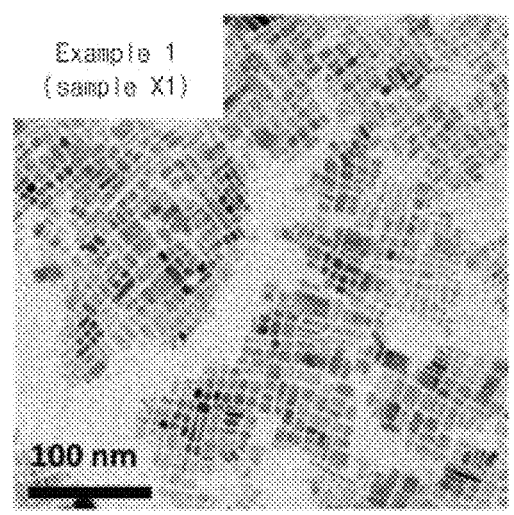

To analyze sizes of the perovskite nanocrystalline particles prepared by a method for producing perovskite nanocrystalline particles using a liquid crystal according to the inventive concept, the nanocrystalline particles in Sample X1 of Example 1 and Comparative Example 1 are observed with an electron microscope, and the results are shown in FIGS. 4 and 5.

FIG. 4 illustrates photographs observed with a scanning electron microscopy (SEM) to compare sizes of the perovskite crystal particles according to Sample X1 of Example 1 and Comparative Example 1.

FIG. 5 illustrates photographs observed with a transmission electron microscopy (TEM) to compare sizes of perovskite nanocrystalline particles according to Sample X1 of Example 1 and Comparative Example 1.

Referring to FIG. 4, in the case of Comparative Example 1, crystal particles of various sizes and shapes within 2 μm could be observed, whereas in the case of Example 1, only nanocrystalline particles within several tens of nanometers could be observed.

That is, in Comparative Example 1, the crystal particles having the size to several micrometers from a few hundred nanometers were observed, and accordingly, in the case of Example 1 using the liquid crystal, it may be confirmed that the nanocrystalline particle size may be controlled during synthesis.

FIG. 5 illustrates result observed with a transmission electron microscopy (TEM) to compare sizes of perovskite nanocrystalline particles according to Sample X1 of Example 1 and Comparative Example 1. When observing the perovskite crystal particles according to Comparative Example 1, the perovskite crystal particles have a cubic shape, and nanocrystalline particles having a size of approximately 10 nm and nanocrystalline particles having a size of approximately 100 nm or more are observed together. On the other hand, when observing Sample X1 prepared according to Example 1, the nanocrystalline particles, which have a size of about 10 nm and are excellent in size and uniformity, are observed.

<Experimental Example 3> Photoluminescence Wavelength Analysis 1

Figure 6:
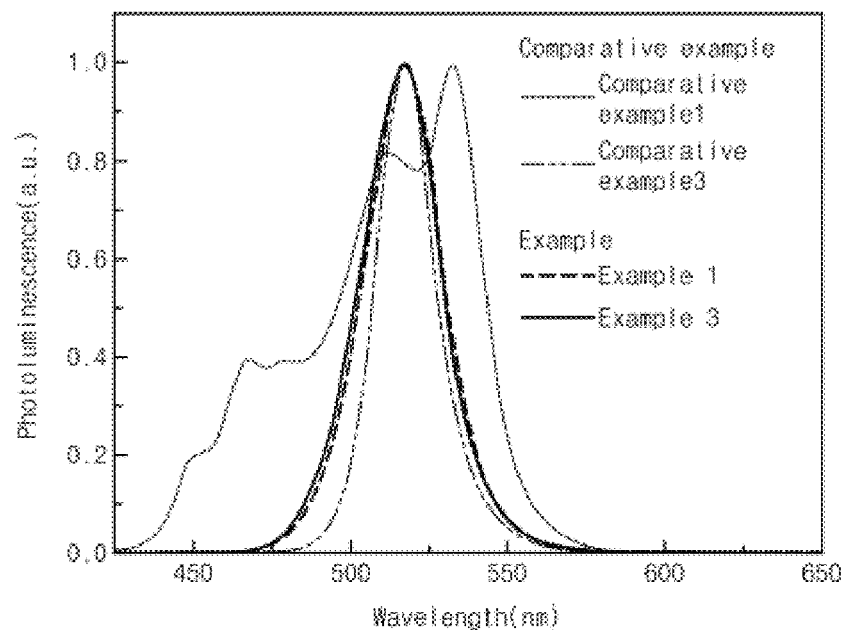
FIG. 6 is a graph comparing photoluminescence characteristics of quantum dot dispersions prepared according to Sample X1 of Example 1 and Comparative Example 1 and quantum dot dispersions prepared according to Example 3 and Comparative Example 3.

To analyze photoluminescence properties of perovskite nanocrystalline particles prepared by a method for producing perovskite nanocrystalline particles using a liquid crystal according to the inventive concept are analyzed, and photoluminescence characteristics of Sample X1 of Example 1, Example 3, Comparison Example 1, and Comparative Example 3 are analyzed, and the results are shown in FIG. 6.

FIG. 6 is a graph comparing photoluminescence characteristics of quantum dot dispersions prepared according to Sample X1 of Example 1 and Comparative Example 1 and quantum dot dispersions prepared according to Example 3 and Comparative Example 3.

Referring to FIG. 6, quantum dot powder prepared according to Comparative Example 1 has crystal particles of various sizes, and thus photoluminescence peaks are observed at various wavelengths. In addition, it may be seen that the photoluminescence graph of the quantum dot dispersion prepared according to Comparative Example 3 and the photoluminescence graph of the quantum dot dispersion prepared according to Comparative Example 1 are significantly different.

On the other hand, Sample X1 of Example 1 was synthesized with a high yield of nanocrystalline particles, and thus it was not necessary to separate the nanocrystalline particles through additional centrifugation from the quantum dot dispersion. Accordingly, an photoluminescence peak of the quantum dot dispersion of Sample X1 of Example 1 is observed at one wavelength and has small half width, and it was observed that the photoluminescence graph of the quantum dot dispersion according to Example 3 and the photoluminescence graph of the quantum dot dispersion according to Sample X1 of Example 1 have the same shape.

<Experimental Example 4> Photoluminescence Wavelength Analysis 2

Figure 7:
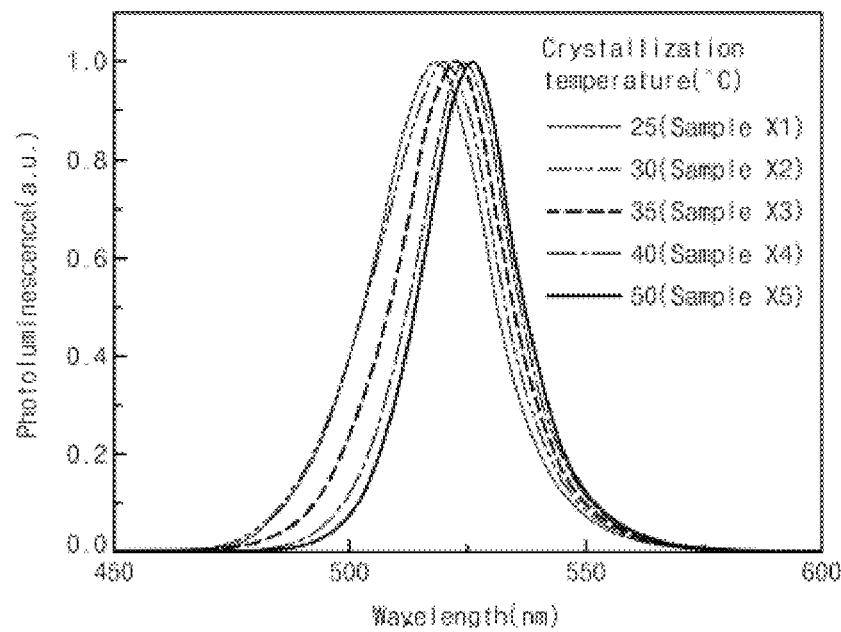
FIG. 7 is a graph illustrating photoluminescence characteristics the quantum dot dispersions prepared according to Samples X1 to X5 of Example 1.
Figure 8:
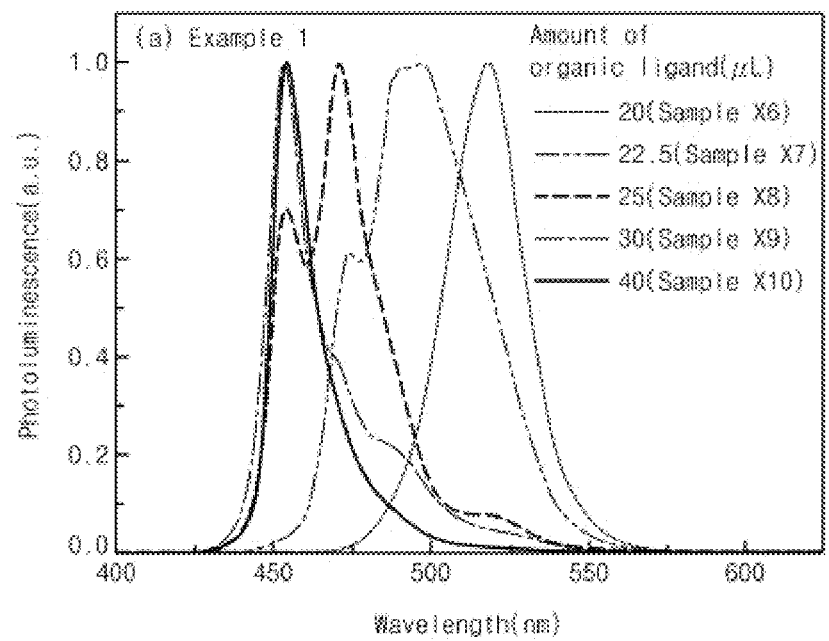
FIG. 8 illustrates a graph and a photograph showing photoluminescence characteristics of quantum dot dispersions prepared according to Samples X6 to X10 of Example 1.
Figure 8:
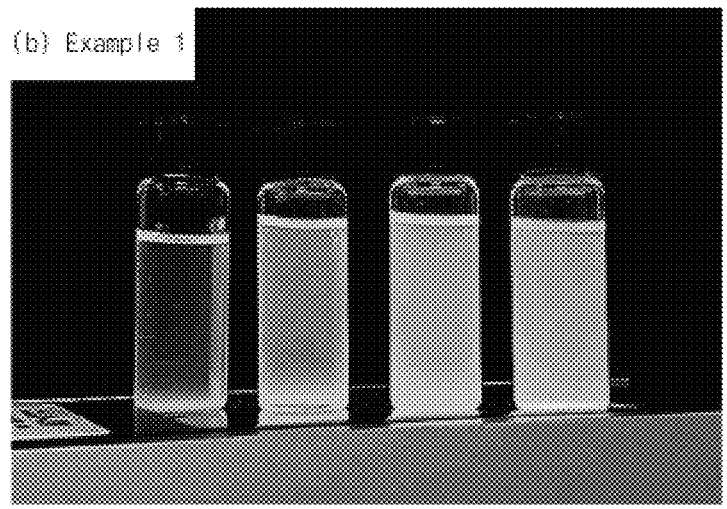

To observe a change in photoluminescence characteristics depending on stirring temperature and the amount of the organic ligand when preparing perovskite nanocrystalline particles using a liquid crystal according to the inventive concept, photoluminescence wavelengths of Samples X1 to X5 of Example 1 and Samples X6 to X10 of Example 1 are analyzed, and the results are shown in FIGS. 7 and 8.

FIG. 7 is a graph illustrating photoluminescence characteristics quantum dot dispersions prepared according to Samples X1 to X5 of Example 1.

FIG. 8 illustrates a graph and a photograph showing photoluminescence characteristics of quantum dot dispersions prepared according to Samples X6 to X10 of Example 1.

Referring to FIG. 7, in the photoluminescence properties of the quantum dot dispersions prepared according to Samples X1 to X5 of Example 1, it may be observed that the extrapolation length of the liquid crystal increases as the stirring temperature increases from 25° C. to 50° C., the size of the nanocrystalline particles increases, and accordingly, the wavelength of the photoluminescence peak becomes red shifted.

FIG. 8A is a photoluminescence graph showing changes in luminescence characteristics of perovskite nanocrystalline particles depending on the amount of octylamine, which is $R^2NH_2$, in the quantum dot dispersion prepared according to Sample X6 to Sample X10 of Example 1, and FIG. 8B shows real images of quantum dot dispersions prepared according to Samples X6 to X10 of Example 1.

Referring to FIG. 8A, when the amount of the organic ligand octylamine increases, the size of the nanocrystalline particles decreases, the quantum confinement effect increases, and thus it may be observed that light of a lower wavelength is emitted. As the size of the perovskite nanocrystalline particles is controlled, it may be seen that the wavelength of light emitted by the quantum confinement effect varies from 450 nm to 520 nm.

The detailed description above is illustrative of the inventive concept.

Also, the inventive concept is explained by describing the preferred embodiments and will be used through various combinations, modifications and environments. That is, the inventive concept may be amended or modified, not being out of the scope, technical idea or knowledge in the art. Further, it is not intended that the scope of this application be limited to these specific embodiments or to their specific features or benefits. Rather, it is intended that the scope of this application be limited solely to the claims which now follow and to their equivalents. Further, the appended claims should be appreciated as a step including even another embodiment.

The invention claimed is:

1. A method of producing perovskite nanocrystalline particles using a liquid crystal, the method comprising:
   a first operation for preparing a mixed solution including a first precursor compound represented by a following formula (1), a second precursor compound represented by a following formula (2), and a first solvent;

a second operation for preparing a precursor solution by adding an organic ligand to the prepared mixed solution;

a third operation for performing crystallization treatment after adding the prepared precursor solution to a reactor containing the liquid crystal; and a fourth operation for separating the perovskite nanocrystalline particles from the crystallized solution through a centrifugal separator;

$$AX \quad \text{[Formula 1]}$$

(in Formula 1, "A" is $Cs^+$ or an organic cation; "X" is at least one anion selected from a group consisting of $Br^-$, $Cl^-$, and $I^-$), $$BX_2 \quad \text{[Formula 2]}$$

(in Formula 2, "B" is at least one cation selected from a group consisting of $Pb^{2+}$, $Sn^{2+}$, $Bi^{2+}$, $Sb^{2+}$, and $Mn^{2+}$; "X" is at least one anion selected from a group consisting of $Br^-$, $Cl^-$, and $I^-$).

2. The method of claim 1, wherein the first operation includes:

preparing a precursor mixture by mixing the first precursor compound and the second precursor compound at a molar ratio of 1:1 to 1.25; and dissolving the prepared precursor mixture in the first solvent to be ionized.

3. The method of claim 2, wherein, in the first operation, the first solvent is a polar aprotic solvent, and the polar aprotic solvent is at least one material selected from a group consisting of dimethylformamide and dimethylsulfoxide.

4. The method of claim 1, wherein the organic cation is at least one cation selected from a group consisting of methyl ammonium cation, formamidinium cation, and phenylethylammonium cation.

5. The method of claim 1, wherein, in the second operation, the organic ligand includes $R^1COOH$ and $R^2NH_2$, and the $R^1$ and the $R^2$ are a saturated alkyl group or an unsaturated alkenyl group having 6 to 28 carbon atoms, regardless of each other.

6. The method of claim 4, wherein, in the second operation, the organic ligand is prepared by mixing the $R^1COOH$ and the $R^2NH_2$ in a volume ratio of 1:0.01 to 0.1.

7. The method of claim 6, wherein, in the second operation, the organic ligand is prepared by mixing the $R^2NH_2$ and the $R^1COOH$ in a volume ratio of 1:10 to 100.

8. The method of claim 7, wherein in the third operation includes:

preparing a fluid mixture by mixing the prepared precursor solution and the liquid crystal; and stirring the prepared fluid mixture at a stirring temperature in a range of 25 to 65° C. for 1 to 3 hours.

9. The method of claim 8, wherein, in the stirring, the liquid crystal acts as a non-solvent for the first precursor compound and the second precursor compound to induce generation and growth of perovskite crystal nuclei, to form the perovskite nanocrystalline particles.

10. The method of claim 9, wherein, in the stirring, the perovskite nanocrystalline particles are limited in particle growth by elastic force of the liquid crystal which occurs when the perovskite nanocrystalline particles become larger than an extrapolation length defined by an elastic constant and a surface anchoring coefficient of the liquid crystal.

11. The method of claim 10, wherein the extrapolation length defined by the liquid crystal is controlled depending on the amount of $R^1COOH$ contained in the organic ligand, the amount of $R^2NH_2$ contained in the organic ligand, or the stirring temperature, and the size of the perovskite nanocrystalline particles is controlled by controlling the extrapolation length.

* * * * *